(12) United States Patent
Kimura et al.

(10) Patent No.: US 7,305,761 B2
(45) Date of Patent: Dec. 11, 2007

(54) METHOD FOR MANUFACTURING WIRING SUBSTRATE

(75) Inventors: Satoshi Kimura, Fujimi (JP); Hidemichi Furihata, Chino (JP)

(73) Assignee: Seiko Epson Corporation (JP)

( * ) Notice: Subject to any disclaimer, the term of this patent is extended or adjusted under 35 U.S.C. 154(b) by 260 days.

(21) Appl. No.: 11/091,891

(22) Filed: Mar. 28, 2005

(65) Prior Publication Data

US 2005/0218487 A1    Oct. 6, 2005

(30) Foreign Application Priority Data

Mar. 30, 2004   (JP)   ............... 2004-098684

(51) Int. Cl.
*H05K 3/02*   (2006.01)
*H05K 3/10*   (2006.01)

(52) U.S. Cl. ............... 29/846; 29/830; 29/847; 205/167; 427/97.4; 427/99.1; 430/16

(58) Field of Classification Search ............ 29/825, 29/846, 847, 851, 830; 174/255–257; 205/157, 205/167; 427/97.4, 98.6, 99.1, 125, 205, 427/304–306, 322, 558; 257/E21.17, E21.174; 430/16; 523/300
See application file for complete search history.

(56) References Cited

U.S. PATENT DOCUMENTS 3,684,572 A * 8/1972 Taylor ..................... 427/306
5,079,600 A * 1/1992 Schnur et al. ......... 257/E21.174
5,510,216 A * 4/1996 Calabrese et al. ............ 430/16
5,684,065 A * 11/1997 Hiraoka et al. ............. 523/300

FOREIGN PATENT DOCUMENTS

JP    07-263841    10/1995

* cited by examiner

*Primary Examiner*—Minh Trinh
*Assistant Examiner*—Donghai D. Nguyen
(74) *Attorney, Agent, or Firm*—Harness, Dickey & Pierce, P.L.C.

(57) ABSTRACT

A method for manufacturing a wiring substrate includes the steps of: (a) forming a ground layer precursor having reactive groups including nitrogen atoms in first and second areas of a substrate; (b) irradiating light energy to remove the reactive groups from the ground layer precursor to thereby form a ground layer charged in cathode; (c) patterning a cationic surface-active agent of anode to be left on the first area of the substrate with the ground layer as a ground; (d) providing a catalyst at the surface-active agent; and (e) forming a wiring along the first area of the substrate by precipitating a metal layer to the catalyst.

10 Claims, 3 Drawing Sheets

METHOD FOR MANUFACTURING WIRING SUBSTRATE

RELATED APPLICATIONS

This application claims priority to Japanese Patent Application No. 2004-098684 filed Mar. 30, 2004 which is hereby expressly incorporated by reference herein in its entirety.

BACKGROUND

1. Technical Field

The present invention relates to a method for manufacturing wiring substrates and a method for manufacturing electronic devices.

2. Related Art

A subtractive method and an additive method are known as a method for forming wirings on a flexible substrate. In the subtractive method, a metal layer is formed over the entire surface of a flexible substrate, a photoresist is formed on the metal layer by patterning, and the metal layer is etched by using the photoresist as a barrier. In the additive method, a photoresist is formed on a flexible substrate by patterning, and a metal layer is deposited by a plating process in an opening section in the photoresist.

These methods entail problems concerning consumptions of resources and raw materials, in view of the fact that the photoresist is finally removed, and further in view of the fact that a part of the metal layer is removed in the subtractive method. Also, they require the steps of forming and removing a photoresist, which results in a problem of a large number of manufacturing steps. Furthermore, because the measurement accuracy of wirings depends on the resolution of a photoresist, there is a limit in forming wirings at a higher level of accuracy.

It is an object of the present invention to deposit a metal layer only in a required portion, and form wirings with a simple manufacturing process.

SUMMARY

A method for manufacturing a wiring substrate, in accordance with the present invention, includes the steps of:

(a) forming a ground layer precursor having reactive groups including nitrogen atom in first and second areas of a substrate;

(b) irradiating light energy to remove the reactive groups from the ground layer precursor to thereby form a ground layer;

(c) patterning a surface-active agent to be left on the first area of the substrate with the ground layer as a ground;

(d) providing a catalyst at the surface-active agent; and (e) forming a wiring along the first area of the substrate by precipitating a metal layer to the catalyst.

In accordance with the present invention, a ground layer precursor is formed into a ground layer by irradiation of light energy, and a surface-active agent is patterned on the ground layer. As a result, an area that adsorbs catalyst and an area that does not adsorb catalyst are formed on the substrate, such that catalyst and metal layers can be formed only on required portions along a predetermined patterned configuration. Furthermore, because the steps of forming and removing photoresist can be omitted, wirings can be formed with a simple manufacturing process.

A method for manufacturing a wiring substrate, in accordance with the present invention, includes the steps of:

(a) forming a ground layer precursor having reactive groups including nitrogen atoms in first and second areas of a substrate;

(b) irradiating light energy to remove the reactive groups from the ground layer precursor to thereby form a ground layer;

(c) patterning a surface-active agent to be left on the first area of the substrate with the ground layer as a ground;

(d) providing a catalyst at an opening section through the surface-active agent at the ground layer; and (e) forming a wiring along the second area of the substrate by precipitating a metal layer to the catalyst.

In accordance with the present invention, a ground layer precursor is formed into a ground layer by irradiation of light energy, and a surface-active agent is patterned on the ground layer. As a result, a catalyst adsorption area and a catalyst non-adsorption area are formed on the substrate, such that catalyst and metal layers can be formed only on required portions along a predetermined patterned configuration. Furthermore, because the steps of forming and removing photoresist can be omitted, wirings can be formed with a simple manufacturing process.

In the method for manufacturing a wiring substrate, in the step (b), the reactive group may be removed to charge the ground layer in cathode, and in the step (c), as the surface-active agent, a cationic surface-active agent that becomes anodic may be patterned.

As a result, the surface-active agent that is anodic is patterned on the ground layer that is cathodic, such that a catalyst adsorption area caused by electrostatic attracting force and a catalyst non-adsorption area can be formed.

In the method for manufacturing a wiring substrate, in the step (b), vacuum ultraviolet radiation may be irradiated as the light energy.

In the method for manufacturing a wiring substrate, the ground layer precursor may be formed of an organic silane compound.

In the method for manufacturing a wiring substrate, in the step (b), the organic silane compound may be oxidized.

In the method for manufacturing a wiring substrate, the step (c) may include (c$_1$) providing the surface-active agent to be left on the first and second areas of the substrate with the ground layer as ground, and (c$_2$) removing an area of the surface-active agent which overlaps the second area of the substrate by irradiation of light energy.

According to this method, light energy is used for the step of forming the ground layer, as well as for the step of patterning the surface-active agent, the manufacturing process is simplified and made more effective.

In the method for manufacturing a wiring substrate, in the step (c$_2$), vacuum ultraviolet radiation may be irradiated as the light energy.

In method for manufacturing a wiring substrate, in the step (c), a liquid material that becomes the surface-active agent may be jetted to be left in the first area of the substrate with the ground layer as a ground. By this, surface-active agent can be formed only on required portions such that the waste of materials can be reduced. Also, in the step of patterning the surface-active agent, the steps of forming and removing photoresist can be omitted, such that wirings can be formed with a simple manufacturing process.

A method for manufacturing an electronic device in accordance with the present invention includes the method for manufacturing a wiring substrate described above, and further includes the steps of mounting a semiconductor chip having an integrated circuit on the wiring substrate, and mounting the wiring substrate on a circuit substrate.

DETAILED DESCRIPTION

Embodiments of the present invention are described below with reference to the accompanying drawings.

FIG. 1-FIG. 9 are views illustrating a method for manufacturing a wiring substrate in accordance with an embodiment of the present invention. In the present embodiment, a wiring substrate is manufactured using an electroless plating method.

A substrate 10 may be composed of an organic material, and may be composed of a plastic substrate (a resin substrate), for example. The plastic substrate may be composed of, for example, polyimide, polyethylene naphthalate, polycarbonate, polyphenylene sulfide, polyethylene terephthalate, or the like material. Plastic substrates may have different adsorptivities to catalyst due to a small amount of additive contained and/or surface treatment even when they are made of the same material, and therefore the application of the present invention is effective.

The substrate 10 may be a flexible substrate (having a thickness of 25-100 μm, for example). As the flexible substrate, a FPC (Flexible Printed Circuit), a COF (Chip On Film) substrate, or a TAB (Tape Automated Bonding) substrate can be enumerated.

As a modified example, the substrate 10 may be composed of an inorganic system material (for example, glass substrate or a ceramic substrate), or may be composed of organic system and inorganic system compound material (for example glass epoxy substrate).

In the present embodiment, a wiring is formed on one of surfaces of the substrate 10. Alternatively, as a modified example, wirings may be formed on both of the surfaces of the substrate 10. The substrate 10 has a first area 12 and a second area 14 (see FIG. 5). The first area 12 and the second area 14 are areas in the surface of the substrate 10 where wirings are formed. Wirings are formed only in either the first area 12 or the second area 14.

Figure 1:
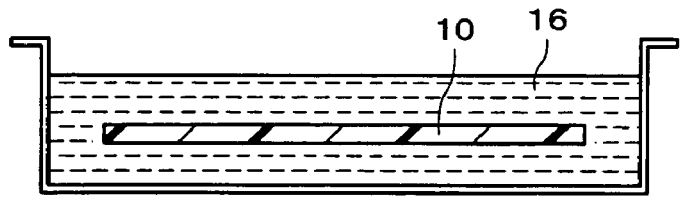
FIG. 1 is a view indicating a method for manufacturing a wiring substrate in accordance with an embodiment of the present invention.

As shown in FIG. 1, the step of cleaning the substrate 10 is conducted. The substrate 10 may be wet-washed. For example, the substrate 10 may be dipped in a washing solution (for example, an alkaline solution) 16. Concretely, the substrate 10 is dipped in a sodium hydroxide (with a concentration of 1 wt %-10 wt %) under room temperature for about 2-15 minutes, and then washed with water. Dirt such as oils and fats that adhere to the surface of the substrate 10 may be removed by the cleaning step. Also, a surface roughening treatment may be applied to the substrate 10. Furthermore, the surface of the substrate 10 may be changed from water-repellent to hydrophilic. For example, in the case of a polyimide substrate, its surface can be changed to hydrophilic by washing with sodium hydroxide for about ten minutes. Accordingly, the bonding force of wirings to the substrate 10 improves.

As a modified example, the substrate 10 may be dry-washed. For example, light energy is irradiated to the first and second areas 12 and 14 of the substrate 10. Vacuum ultraviolet radiation to be described below may be irradiated as the light energy. Concretely, a vacuum ultraviolet radiation lamp with a wavelength of 172 nm (with an output of 10 mW and a lamp-to-sample distance being 1 mm) may be irradiated in a nitrogen atmosphere for 30 seconds-180 seconds.

Figure 2:
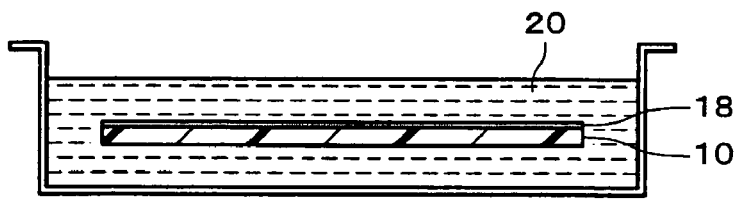
FIG. 2 is a view indicating the method for manufacturing a wiring substrate in accordance with the embodiment of the present invention.

A ground layer precursor 18 is formed in the first area 12 and the second area 14 of the substrate 10, as shown in FIG. 2. The ground layer precursor 18 may be formed over the entire surface of the substrate 10.

The ground layer precursor 18 is formed of an organic compound, and has reactive groups including nitrogen atoms. Amino groups, ammonium groups, etc. that are already known are pertinent to the reactive groups including nitrogen atoms. The ground layer precursor 18 may be a surface-active agent. Among cation system surface-active agents (cation surface-active agent and those having equal properties thereof), many of them have reactive groups including nitrogen atoms. The ground layer precursor 18 may be an organic silane compound (having reactive groups including nitrogen atoms). For example, the substrate 10 may be dipped in a solution 20 of water-soluble surface-active agent (FPD conditioner by Technique Japan Ltd.) including aminosilane system elements. After being removed from the solution 20, the substrate 10 is washed with ultrapure water, and naturally dried under room temperature, or dried by blowing compressed air. In this manner, the ground layer precursor 18 formed of an organic silane compound may be formed.

As a modified example, the ground layer precursor 18 may be formed with coupling agent. The coupling agent has reactive groups including nitrogen atoms. The coupling agent may be an organic silane compound.

Figure 3:
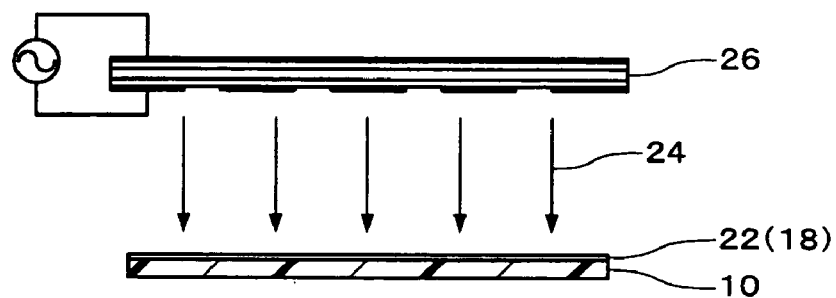
FIG. 3 is a view indicating the method for manufacturing a wiring substrate in accordance with the embodiment of the present invention.

As shown in FIG. 3, the reactive groups including nitrogen atoms are removed from the ground layer precursor 18, thereby forming a ground layer 22. The entirety of the ground layer precursor 18 may be formed into the ground layer 22. When a part (for example, ammonium groups (NH4+)) removed from the ground layer precursor 18 is charged in anode, the ground layer 22 is charged in cathode.

As a method of forming the ground layer 22, light energy may be irradiated to the entire surface of the ground layer precursor 18. In other words, intermolecular bonds between the reactive groups including nitrogen atoms and the organic compound are resolved by the irradiation of light energy. Organic elements of the ground layer precursor 18 may be resolved and removed by the irradiation of light energy. It is noted that the light energy may be any one of visible radiation, ultraviolet radiation, vacuum ultraviolet radiation, and X radiation, and its wavelength band is not limited.

The ground layer precursor 18 may be oxidized. For example, silicon oxide may be generated from the organic silane compound by irradiating ultraviolet radiation (with a wavelength of 250 nm-320 nm, for example) as the light energy. In other words, a layer that is formed of an inorganic compound (an inorganic silane compound) may be formed on the substrate 10.

In the present embodiment, vacuum ultraviolet radiation (VUV: vacuum ultraviolet radiation) 24 is irradiated as the light energy. The wavelength of the vacuum ultraviolet radiation 24 may be 100 nm-200 nm (for example, 100 nm-180 nm). An excimer lamp where Xe gas is enclosed may be used as a source of light 26 (with a wavelength of 172 nm). By using the lamp, a condenser lens for generating a laser beam and the time for scanning with the laser beam become unnecessary, and thus the manufacturing process can be simplified. Moreover, because its wavelength is small, the irradiation output of light can be suppressed. In addition, the load against heat is alleviated, such that the degree of freedom in selecting materials for the substrate 10 is increased.

Concretely, a vacuum ultraviolet radiation lamp with a wavelength of 172 nm (with an output of 10 mW and a lamp-to-sample distance being 1 mm) may be irradiated in a nitrogen atmosphere for 5 minutes-15 minutes. The ground layer 22 remains in the first and second areas 12 and 14 of the substrate 10 after the vacuum ultraviolet radiation 24 is irradiated.

Next, the surface-active agent 28 is patterned to be left in the first region 12 over the substrate 10 with the ground layer 22 as a ground.

The surface-active agent 28 may have a property to become anodic (cationized) in a solution. For example, the surface-active agent 28 may be a cation system surface-active agent (cation surface-active agent and those having an equal property thereof). The surface-active agent 28 may be composed of the same material as that of the ground layer precursor 18, or may be composed of a different material. When the ground layer 22 is cathodic, by patterning the surface-active agent 28 that becomes anodic, an anode is formed in an area where the surface-active agent 28 remains (the first area 12) (or the cathode of the ground layer 22 is neutralized), and an area where the surface-active agent 28 does not remain (the second area 14) remains to be cathodic.

Figure 4:
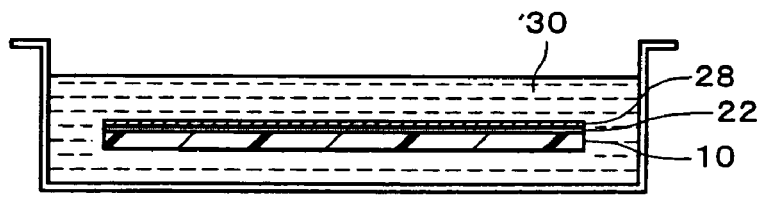
FIG. 4 is a view indicating the method for manufacturing a wiring substrate in accordance with the embodiment of the present invention.
Figure 5:
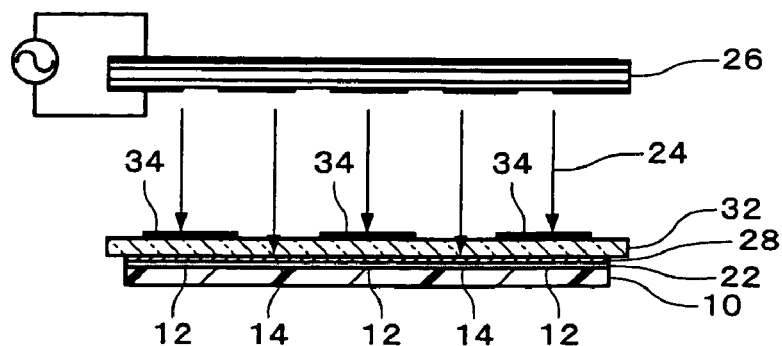
FIG. 5 is a view indicating the method for manufacturing a wiring substrate in accordance with the embodiment of the present invention.

In the patterning method, first, the surface-active agent 28 is provided to be remained in the first and second areas 12 and 14 of the substrate 10 with the ground layer 22 as a ground. For example, the substrate 10 may be dipped in a surface-active agent solution 30 (for example, a solution of alkyl ammonium system, amine system, or the like) for one minute, as shown in FIG. 4. After being removed from the solution 30, the substrate 10 is washed with ultrapure water, and naturally dried under room temperature, or dried by blowing compressed air. Then, as shown in FIG. 5, areas of the surface-active agent 28 that overlap with the second areas 14 of the substrate 10 are removed by irradiating light energy. Accordingly, light energy is used for the step of forming the ground layer 22, as well as for the step of patterning the surface-active agent 28, such that the manufacturing process is simplified and made more effective. The light energy here may be the same as the light energy used to form the ground layer 22, or may be different. If the same light energy is used, the property of the ground layer 22 would not change even when the light energy irradiated in the patterning of the surface-active agent 28 is irradiated to the ground layer 22, and therefore the manufacturing process can be stabilized.

In the present embodiment, vacuum ultraviolet radiation 24 is irradiated as the light energy. The vacuum ultraviolet radiation 24 has properties that can be derived from the description of the step of forming the ground layer 22. However, a mask 32 is used in this step. More specifically, a mask 32 is disposed between the source of light 26 and the substrate 10, and the vacuum ultraviolet radiation 24 is irradiated to the substrate 10 through the mask 32. The mask 32 may be a photomask, or may be a metal mask. For example, as the mask 32, a mask of high purity silica glass for vacuum ultraviolet radiation (with a transmittance of 80% or higher to vacuum ultraviolet radiation) having a pattern of chrome formed thereon is used. The mask 32 may be stuck to the substrate 10 (the surface-active agent 28). The vacuum ultraviolet radiation 24 is covered by the pattern 34 of the mask 32, and penetrates other areas thereof. The pattern 34 overlaps with the first area 12, and opens at the second area 14. The source of light 26, the mask 32, and the substrate 10 may be disposed under a nitrogen atmosphere. If it is in the nitrogen atmosphere, the vacuum ultraviolet radiation 24 is irradiated up to the distance of about 10 mm without attenuating. The source of light 26 is brought close to the substrate 10 as much as possible (for example, 10 mm or less). For example, as the source of light 26, an excimer VUV/03 Cleaning Unit (Manufacturer's name; Ushio Electric Co., Model; UER20-172A/B, and Lamp specification; Dielectric barrier discharge excimer lamp enclosing Xe gas therein) may be used. Concretely, a vacuum ultraviolet radiation lamp with a wavelength of 172 nm (with an output of 10 mW and a lamp-to-sample distance being 1 mm) may be irradiated in a nitrogen atmosphere for 180 seconds-600 seconds.

Figure 6:
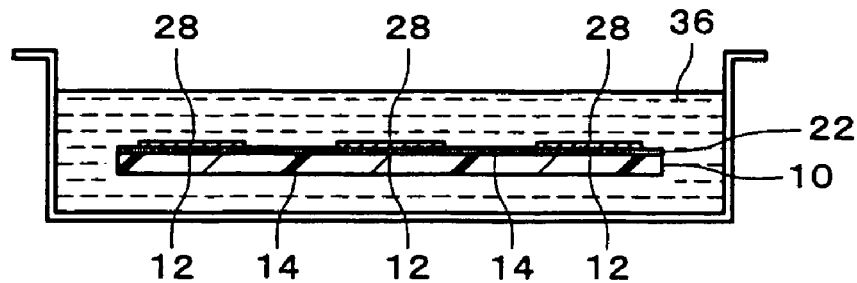
FIG. 6 is a view indicating the method for manufacturing a wiring substrate in accordance with the embodiment of the present invention.

A step of washing the substrate 10 (for example, a wet-washing step) may be conducted, as shown in FIG. 6, after the vacuum ultraviolet radiation 24 is irradiated. For example, the substrate 10 is dipped in a cleaning solution 36 (for example, an alkaline solution). By this way, portions (above the second areas 14) among the surface-active agent 28 where the vacuum ultraviolet radiation 24 is irradiated can be removed.

Figure 9:
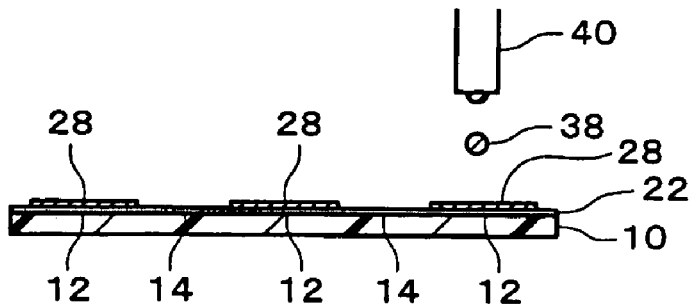
FIG. 9 is a view indicating the method for manufacturing a wiring substrate in accordance with the embodiment of the present invention.

According to a modified example of the patterning method, as shown in FIG. 9, a liquid material 38 that becomes the surface active agent 28 may be jetted to be remained in the first region 12 of the substrate 10 with the ground layer 22 as a ground. In other words, the liquid material 38 may be discharged so as to adhere to the ground layer 22 only above the first area 12 of the substrate 10. As a result, the surface active agent 28 can be formed only to required portions, such that the waste of raw material can be reduced. Moreover, because the photoresist formation and removal steps can be omitted, the manufacturing process is simple. The ink discharge method may be an ink jet method. According to the ink jet method, the technology that has been put to practical use for ink jet printers can be applied, and the liquid material 38 can be provided economically at high-speeds. As the ink jet head (droplet discharge section 40), a piezoelectric jet type that uses piezoelectric elements, or a bubble jet (registered trademark) type that uses electrothermal conversion elements as energy generation elements can be used.

As a modified example of the patterning method, a printing method (for example, a screen printing method) may be used, to thereby pattern the surface-active agent 28 (not shown). More specifically, a print mask that overlaps only with the first area 12 of the substrate 10 is disposed on the ground layer 22, and droplet raw material that becomes the surface-active agent 28 may be filled in apertures (above the second area 14) in the print mask.

Figure 7:
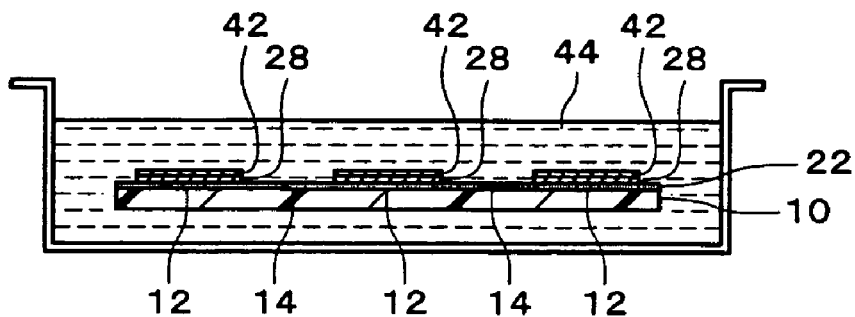
FIG. 7 is a view indicating the method for manufacturing a wiring substrate in accordance with the embodiment of the present invention.

A catalyst 42 is provided, as shown in FIG. 7. The catalyst 42 causes the precipitation of a metal layer (plating layer) in an electroless plating liquid, and may be, for example, palladium.

In the present embodiment, the catalyst 42 is provided to remain on the surface active agent 28 (the first area 12). Concretely, the substrate 10 may be dipped in a tin-palladium colloidal catalyst liquid 44, such that tin-palladium colloidal particles may be adsorbed to the surface active agent 28. Because the tin-palladium colloidal particles are made anionic, they are adsorbed to the surface-active agent (anode) 28, but not adsorbed to the ground layer 22 (cathode). Then, for activation of the catalyst, the substrate 10 is dipped in a fluoroborate acid solution, thereby removing the tin-palladium colloidal particles. In this manner, only palladium (the catalyst 42) can be left on the surface-active agent 28.

As a modified example, the catalyst may be provided to remain in opening sections (the second areas 14) in the surface active agent 28 on the ground layer 22. Concretely, the substrate 10 is dipped in a tin chloride (II) solution, whereby tin ions ($Sn^{2+}$) are adsorbed to the ground layer 22. Then, by dipping the substrate 10 in a palladium chloride catalyst liquid, palladium (catalyst) can be left on the ground layer 22.

Figure 8:
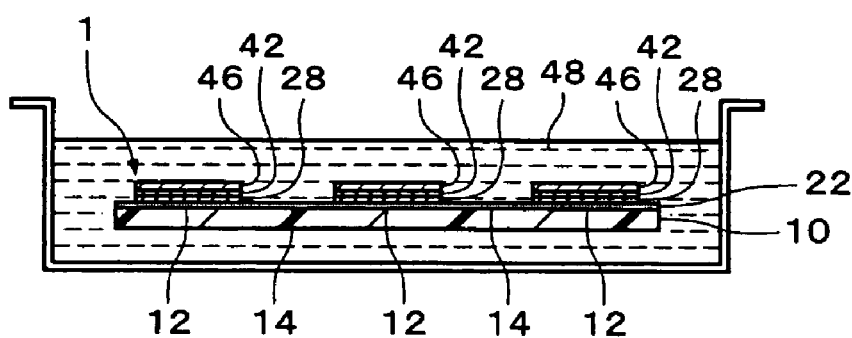
FIG. 8 is a view indicating the method for manufacturing a wiring substrate in accordance with the embodiment of the present invention.

A metal layer 46 is precipitated to the catalyst 42, as shown in FIG. 8. In the present embodiment, because the catalyst 42 is left along the first area 12, the metal layer 46 can be formed along the first area 12. In this manner, a wiring that is formed of the metal layer 46 can be formed along the first area 12. Alternatively, as indicated in the modified example, when the catalyst is left along the second area 14, the metal layer 46 can be formed along the second area 14. The metal layer 46 can be formed with one layer, or may be formed with multiple layers. The material of the metal layer 46 is not particularly limited, and may be, for example, any one of Ni, Au, Ni+Au, Cu, Ni+Cu, and Ni+Au+Cu. The material of the metallic layer 46 is decided according to the material of the catalyst 42.

The metal layer 46 can be precipitated to the catalyst 42 by dipping the substrate 10 in an electroless plating liquid 48. As the electroless plating liquid 48, a liquid that contains nickel sulfide hexahydrate as a main composition and sodium hypophosphite contained as a reducing agent can be used. For example, the substrate 10 may be dipped in such an electroless plating liquid 46 (80° C. in temperature) for 1-3 minutes, whereby a nickel layer having a thickness of 0.1 μm-0.2 μm can be formed. Alternatively, as the electroless plating liquid 48, a liquid that contains nickel chloride hexahydrate as a main composition and sodium hypophosphite contained as a reducing agent can be used. For example, the substrate 10 may be dipped in such an electroless plating liquid 46 (60° C. in temperature) for 3-10 minutes, whereby a nickel layer having a thickness of 0.1 μm-0.2 μm can be formed.

According to the present embodiment, the ground layer precursor 18 is formed into the ground layer 22 by irradiating light energy, and the surface-active agent 28 is patterned on the ground layer 22. As a result, an adsorption area and a non-adsorption area of the catalyst 42 can be formed on the substrate 10. For example, by patterning the surface active agent 28 that is anodic to the ground layer 22 that is cathodic, an adsorption area and a non-adsorption area of the catalyst 42 by electrostatic attraction force can be formed. As a result, the catalyst 42 and the metal layer 46 can be formed only to required portions along the predetermined patterned configuration. In addition, because the steps of forming and removing photoresist can be omitted, wirings can be formed with a simple manufacturing process.

Figure 10:
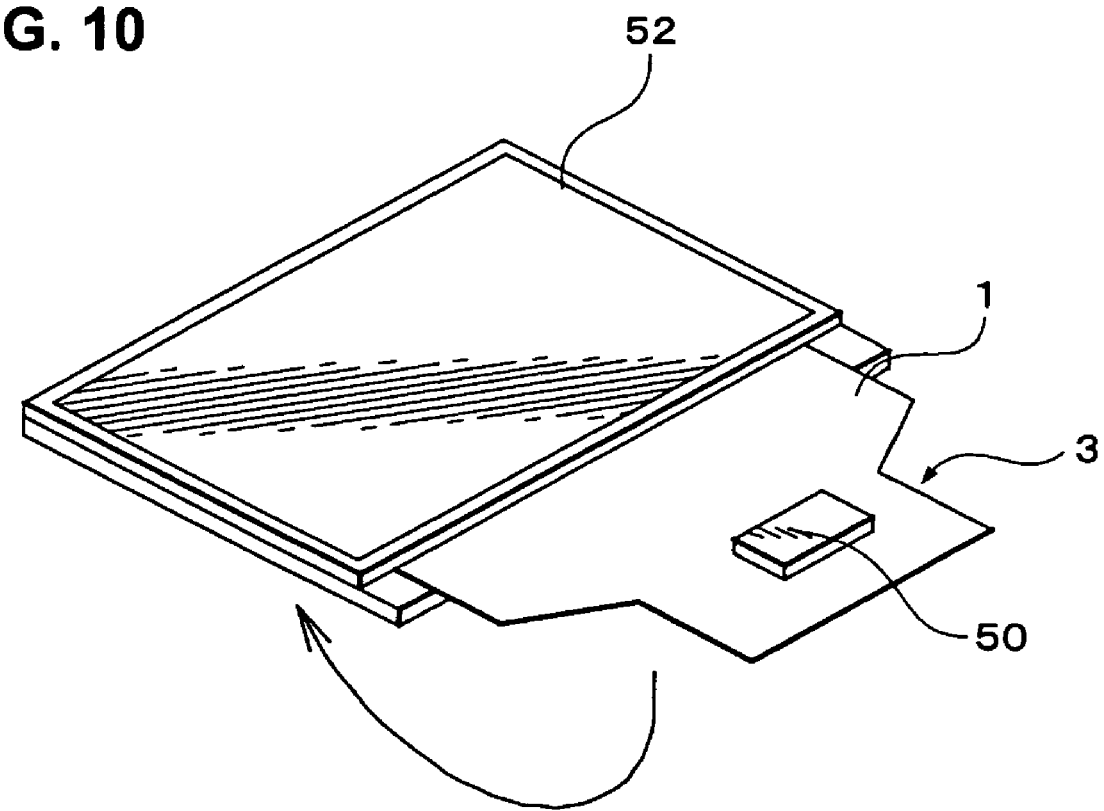
FIG. 10 is a view illustrating a method for manufacturing an electronic device in accordance with an embodiment of the present invention.

FIG. 10 is a view for describing a method for manufacturing an electronic device in accordance with an embodiment of the present invention, and more particularly, shows an example of an electronic device having a wiring substrate.

A metal layer (omitted in FIG. 10) is formed in a wiring substrate 1. A semiconductor chip 50 having an integrated circuit may be mounted (for example, face-down mounted) on the wiring substrate 1. The semiconductor chip 50 (integrated circuit) is electrically connected to the metal layer. In this manner, a semiconductor device 3 including the semiconductor chip 50 and the wiring substrate 1 may be manufactured. Then, the wiring substrate 1 (or, the semiconductor device 3) is electrically connected to a circuit board 52. Thus, the electronic device can be manufactured. It is noted that the wiring substrate 1 may be bent, as indicated.

When the circuit board 52 is an electrooptic panel, the electronic device is an electrooptic device. The electrooptic device may be a liquid crystal device, a plasma display device, an electroluminescence display device, or the like.

The present invention is not limited to the embodiments described above, and many modifications can be made. For example, the present invention may include compositions that are substantially the same as the compositions described in the embodiments (for example, a composition with the same function, method and result, or a composition with the same objects and result). Also, the present invention includes compositions in which portions not essential in the compositions described in the embodiments are replaced with others. Also, the present invention includes compositions that achieve the same functions and effects or achieve the same objects of those of the compositions described in the embodiments. Furthermore, the present invention includes compositions that include publicly known technology added to the compositions described in the embodiments.

What is claimed is:

1. A method for manufacturing a wiring substrate, comprising the steps of:
   (a) forming a ground layer precursor having reactive groups including nitrogen atoms in first and second areas of a substrate;
   (b) irradiating light energy to remove the reactive groups from the ground layer precursor to thereby form a ground layer charged in cathode;
   (c) patterning a cationic surface-active agent of anode to be left on the first area of the substrate with the ground layer as a ground;
   (d) providing a catalyst at the surface-active agent; and
   (e) forming a wiring along the first area of the substrate by precipitating a metal layer to the catalyst.

2. A method for manufacturing a wiring substrate according to claim 1, wherein, in the step (b), vacuum ultraviolet radiation is irradiated as the light energy.

3. A method for manufacturing a wiring substrate according to claim 1, wherein the ground layer precursor comprises an organic silane compound.

4. A method for manufacturing a wiring substrate according to claim 3, wherein, in the step (b), the organic silane compound is oxidized.

5. A method for manufacturing a wiring substrate according to claim 1, wherein the step (c) includes
   ($c_1$) providing the surface-active agent to be left on the first and second areas of the substrate with the ground layer as ground, and
   ($c_2$) removing an area of the surface-active agent which overlaps the second area of the substrate by irradiation of light energy.

6. A method for manufacturing a wiring substrate according to claim 5, wherein, in the step ($c_2$), vacuum ultraviolet radiation is irradiated as the light energy.

7. A method for manufacturing a wiring substrate according to claim 1, wherein, in the step (c), a liquid material that becomes the surface active agent is jetted to be left in the first area of the substrate with the ground layer as a ground.

8. A method for manufacturing a wiring substrate, comprising the steps of:
   (a) forming a ground layer precursor having reactive groups including nitrogen atoms in first and second areas of a substrate;
   (b) irradiating light energy to remove the reactive groups from the ground layer precursor to thereby form a ground layer;
   (c) patterning a surface-active agent to be left on the first area of the substrate with the ground layer as a ground;
   (d) providing a catalyst at the surface-active agent; and
   (e) forming a wiring along the first area of the substrate by precipitating a metal layer to the catalyst;
   wherein the step (c) includes
   ($c_1$) providing the surface-active agent to be left on the first and second areas of the substrate with the ground layer as ground, and
   ($c_2$) removing an area of the surface-active agent which overlaps the second area of the substrate by irradiation of light energy.

9. A method for manufacturing a wiring substrate according to claim 8, wherein, in the step ($c_2$), vacuum ultraviolet radiation is irradiated as the light energy.

10. A method for manufacturing a wiring substrate, comprising the steps of:
    (a) forming a ground layer precursor having reactive groups including nitrogen atoms in first and second areas of a substrate;
    (b) irradiating light energy to remove the reactive groups from the ground layer precursor to thereby form a ground layer;
    (c) patterning a surface-active agent to be left on the first area of the substrate with the ground layer as a ground;
    (d) providing a catalyst at the surface-active agent; and
    (e) forming a wiring along the first area of the substrate by precipitating a metal layer to the catalyst
    wherein, in the step (c), a liquid material that becomes the surface active agent is jetted to be left in the first area of the substrate with the ground layer as a ground.

* * * * *